United States Patent [19]
May et al.

[11] 3,943,342
[45] Mar. 9, 1976

[54] COARSE AND FINE ELECTRONIC RAMP FUNCTION GENERATOR

[75] Inventors: Colin Paul May, Marlow; John Street, Henley-on-Thames, both of England

[73] Assignee: Instron Limited, High Wycombe, England

[22] Filed: July 18, 1974

[21] Appl. No.: 489,790

[30] Foreign Application Priority Data
July 20, 1973 United Kingdom............... 34737/73

[52] U.S. Cl. ............ 235/150.53; 235/152; 318/594
[51] Int. Cl.² ......................................... G06F 7/38
[58] Field of Search ...... 235/197, 183, 150.53, 152, 235/156; 318/592, 593, 594; 340/347 NT, 54

[56] References Cited
UNITED STATES PATENTS

| | | | |
|---|---|---|---|
| 2,922,991 | 1/1960 | Frank.............................. | 318/593 X |
| 3,151,282 | 9/1964 | Fisher.................................. | 318/592 |
| 3,757,100 | 9/1973 | Coleman............................ | 235/197 |
| 3,789,391 | 1/1974 | Brock et al..................... | 318/594 X |

*Primary Examiner*—Joseph F. Ruggiero

[57] ABSTRACT

Electronic ramp function generator having a resolution of $2^p = 2^q \times 2^r$ comprising a coarse digital function generator which provides a ramp consisting of $2^q$ equally spaced steps all of equal height, and a second and synchronized digital function generator which is connected to fill in each of the steps of the coarse ramp with $2^r$ finer steps.

4 Claims, 5 Drawings

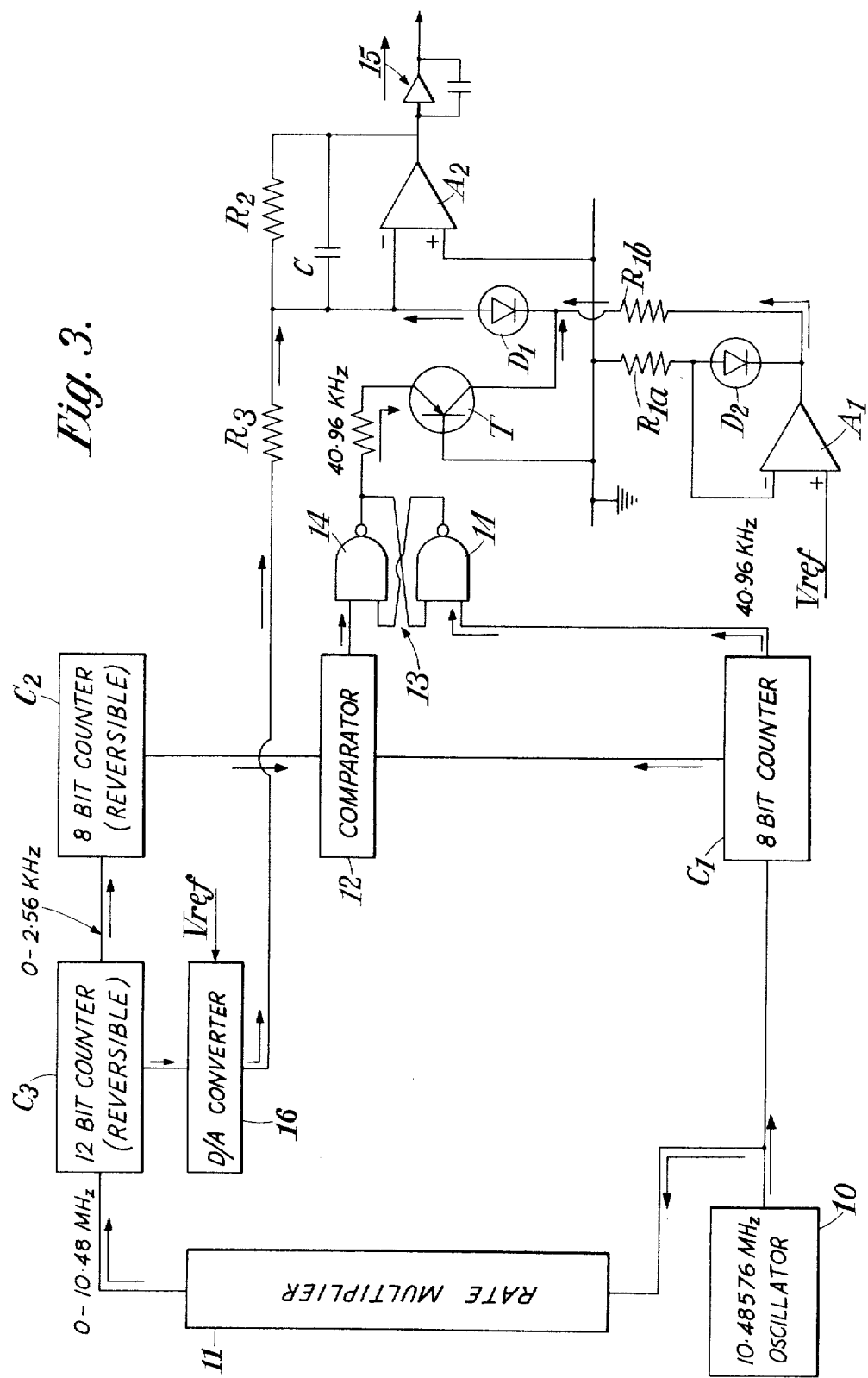

COARSE AND FINE ELECTRONIC RAMP FUNCTION GENERATOR

BACKGROUND OF THE INVENTION

A ramp function generator is used to provide an electrical signal whose value increases linearly with time. Among other applications, such a signal can be used as a 'demand' for a servo control loop such as that incorporated in a material testing machine. In a material testing application, a ramp function generator is used to demand, say, a load of a test specimen that increases at a steady rate. The important features of this demand signal are that:

a. It should be possible to stop, start, and reverse it when required.
b. That, in the stop condition, the signal will not drift.
c. That the ramp, i.e. the rate of variation of the signal with time, shall be variable over a very wide range.
d. That the signal shall increase or decrease smoothly.

It is possible by analogue signal generation utilizing an integrating amplifier, to provide a smooth signal, i.e. one which increases in truly linear fashion with time and without steps, but the other requirements are not met.

A digital technique is therefore more frequently used, a typical example being shown in FIG. 1 of the accompanying drawings.

This includes a binary counter 100, having its input connected to a variable frequency oscillator 110 and its output connected to a digital-to-analogue (D/A) converter 120. The output signal of the converter approximates to the desired linearly increasing ramp signal AB (FIG. 2) but in fact consists of a series of discrete steps as shown greatly exaggerated in FIG. 2, the steps corresponding to the units counted in the counter. The number of steps therefore increases with increase in the number of bits in the counter and so approaches more closely to the ideal as the number of bits is increased. Apart from lack of smoothness of the output signal arising from the relatively low resolution, all the other requirements are met. The slope of the ramp may be varied by altering the frequency of the oscillator. The signal may be reversed by causing the counter to count negatively and may be stopped precisely. In the stop condition it will not drift. This is important in tests for creep.

The resolution presently available from a signal generator of this kind does not exceed 4000–8000 bits per ramp. While this is adequate for many purposes it does not suffice for the tensile and fatique testing of very stiff specimens.

With a view to improving the resolution we investigated the possibility of filling up the steps in the ramp by applying an additional voltage derived from an integrating amplifier. This, however, was not feasible because we found that, while the steps in the ramp occur at regularly timed intervals, they are not precisely equal in height, due to tolerances in resistors which are switched into and out of operation in the D/A converter and in the switches which effect this switching.

SUMMARY OF THE INVENTION

The invention provides an electronic ramp function generator capable of providing a very high degree of resolution, which may in suitable cases be as high as 1,000,000, and therefore a very smoothly increasing or decreasing signal. The generator of the invention further provides a signal which is capable of being stopped, started, and reversed when required, is drift-free in the stop condition, and has a rate of variation with time which is variable over a very wide range.

In general the invention features an electronic ramp function generator having a resolution of $2^p = 2^q \times 2^r$ comprising a coarse digital function generator, which provides a ramp consisting of $2^q$ equally spaced steps all of equal height, and a second and synchronized digital function generator which is connected to fill in each of the steps of the coarse ramp with $2^r$ finer steps.

Preferred embodiments feature a coarse digital function generator comprising a first counter pulsed by a high frequency oscillator, a second counter pulsed at a variable much lower frequency, both counters having q bits, a comparator for comparing the counts in the two counters and arranged to emit a signal upon identity of the counts, a latch which is set by the comparator each time it provides a signal and reset by the first counter each time it returns to zero, and a modulator for converting the pulse train of varying mark/space ratio at the output of the latch to a voltage proportional to said mark/space ratio which varies in $2^q$ steps; a modulator in the coarse digital function generator comprising a switching transistor which is connected to the output of the latch and which conducts only when the voltage in the pulse train at said output is high, a constant current generator, a resistor and a diode between the constant current generator and the resistor which permits of current flow through the resistor only at times when the transistor is not conducting; and a second digital function generator comprising a third counter having r bits, pulsed at a frequency greater than the second counter and arranged to pulse the second counter each time it completes a count, a digital-to-analogue converter connected to the output of the third counter and a connection through a scaling resistor from the output of the converter to a point between the diode and the resistor.

Other advantages and features of the invention will be apparent from the description and drawings herein of a preferred embodiment thereof.

BRIEF DESCRIPTION OF THE DRAWINGS

FIG. 3 is a circuit diagram illustrating one embodiment of the present invention;

DESCRIPTION OF THE PREFERRED EMBODIMENT

Figure 1:
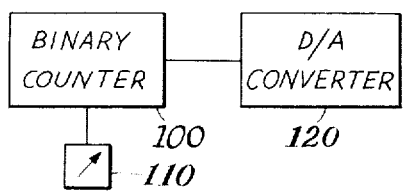
FIG. 1 is a schematic view of a typical known digital technique for ramp generation.
Figure 2:
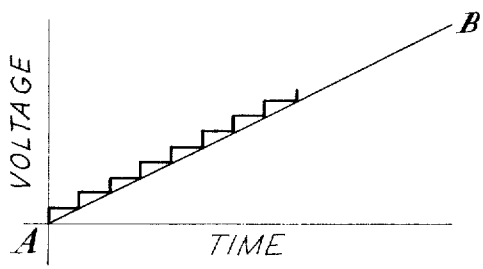
FIG. 2 is a voltage-time plot of the output of the converter of FIG. 1.

As shown in FIG. 3, the circuit includes a high frequency oscillator 10 having a frequency of 10.48576 MHz and having one output connected to the input of an eight bit binary counter $C_1$ and another output connected, through an adjustable rate multiplier 11, to the input of a twelve bit binary counter $C_3$. The rate multiplier 11, which is adjustable by rotary thumb switches, reduces the frequency at the input to the counter $C_3$ by a variable fraction, e.g. 0.1, 0.01, — of that at the output of the oscillator 10. Whenever the counter $C_3$ completes its count, it applies a pulse to the input of an eight bit binary counter $C_2$, which therefore receives pulses at a much lower frequency than the counter $C_1$ depending on the adjustment of the rate multiplier 11.

A digital comparator 12 compares the counts in the counters $C_1$ and $C_2$ and, whenever there is identity of count, sends a signal to an electronic latch 13, constituted by two cross-connected NAND gates 14, to set the latch which is reset each time the counter $C_1$ terminates its count and returns to zero.

Figure 4:
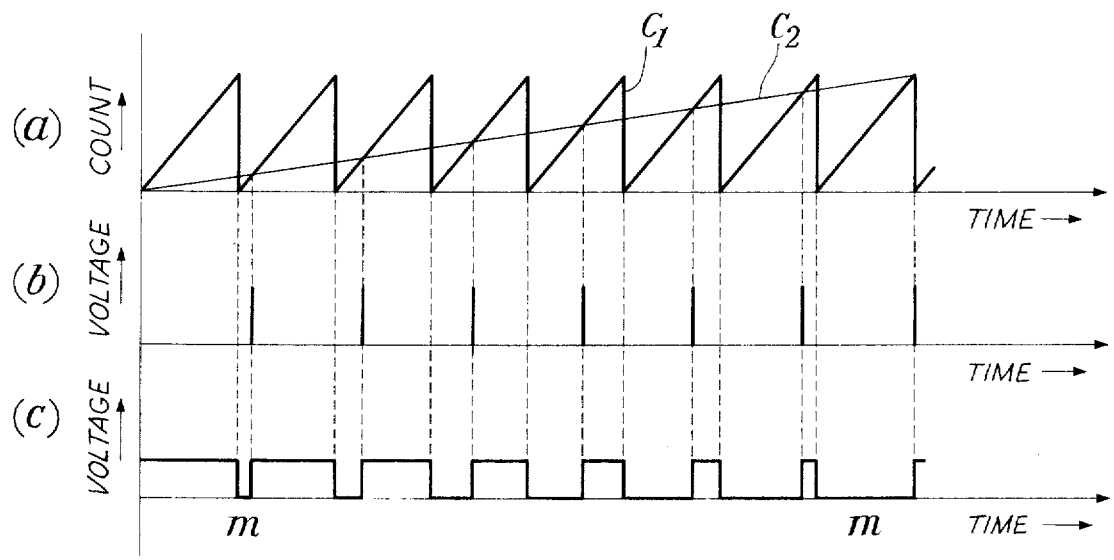
FIG. 4 comprises plots (a) through (c) showing the formation of the train of pulses produced at the output of the latch.

FIG. 4 shows in simplified diagrammatic form, superposed at $a$, the counts of the counters $C_1$ and $C_2$. At $b$ are shown the output signals from the comparator 12, which occur at progressively increasing intervals following return to zero of the count in the counter $C_1$. The output of the latch 13 is thus, as shown at $c$, a train of square pulses in which the mark/space ratio $m$ ($m$ indicating the proportion of the total period of each pulse occupied by the negative going portion of the pulse train) increases in equal steps as the count proceeds in the counter $C_2$. The counters $C_1$ and $C_2$, the comparator 11, and the latch 13 thus constitute a mark-space generator.

The pulse train at the output of the latch 13 is translated into a ramp function by a modulator including a switching transistor T, having its base at zero potential, in association with a constant current generator constituted by a high impedance operational amplifier $A_1$, a diode $D_2$ and two equal resistors $R_{1a}$ and $R_{1b}$. Another high impedance operational amplifier $A_2$, with a resistor $R_2$ and a capacitor C connected in parallel across it, is connected to the constant current generator through a diode $D_1$ having the same characteristics as the diode $D_2$.

When the voltage in the pulse train applied to the emitter of the transistor T is low (i.e., during the mark periods $m$), no current flows through the transistor but a negative current flows from a voltage source Vref through the amplifier $A_1$, the resistor $R_{1b}$, the diode $D_1$, and the resistor $R_2$, the amplifier $A_2$ passing no significant current due to its high impedance. When, however, the voltage in the pulse train at the output of the latch 13 is high, the transistor T conducts and the negative current from the source Vref is diverted through the transistor, the diode $D_1$ receiving a reverse bias so that no current flows through it or the resistor $R_2$. The diode $D_2$ provides a bias to balance the forward voltage drop across the diode $D_1$.

The voltage at the output of the amplifier $A_1$ is $-(\text{Vref} + V\ D_2)$ where $V\ D_2$ is the voltage drop across the diode $D_2$. The current flowing through the resistor $R_{1b}$ would therefore, if it flowed continuously, be $$I = \frac{-(V\text{ref} + V\ D_2 - V\ D_1)}{R_1}$$

where $V\ D_1$ is the voltage drop across the diode $D_1$ and $R_1$ is the resistance of the resistor $R_{1b}$. As the diodes are matched this reduces to $$I = \frac{-V\text{ref}}{R_1}.$$

Since, however, current flows through the diode $D_1$ only during the mark periods $m$, the average current through the resistor $R_2$ is $$\frac{mV\text{ref}}{R_1}$$

and the voltage at the output of the amplifier $A_2$ is $$\frac{mV\text{ref}\ R_2}{R_1},$$

i.e. a voltage which increases in a series of 256 equal steps upon increase in the value of $m$, each step representing $$\frac{V\text{ref}}{256}\frac{R_2}{R_1}.$$

The modulator thus derives from the pulse train at the output of the latch 13 a voltage proportional to the mark/space ratio m which in this case is the proportion of each cycle of the pulse train occupied by the low voltage periods of the train. As an alternative the modulator could be made responsive to the duration of the high voltage periods.

Figure 5:
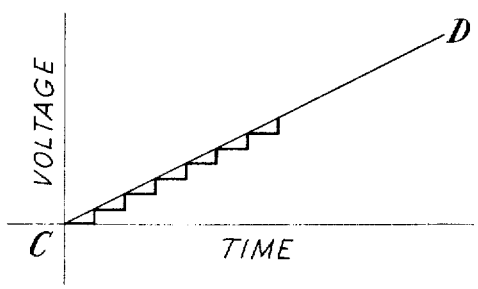
FIG. 5 is a voltage-time plot illustrating the filling in of the steps of the ramp produced by the coarse digital function generator.

The voltage at the output of the amplifier $A_2$ arising from the mark/space generator and the modulator is thus a ramp function consisting of 256 steps as indicated diagrammatically in FIG. 5.

While the capacitor C has a smoothing effect on the ripple in the output voltage the output signal is nevertheless passed through one or more low pass filter stages to remove residual ripple. Such a filter stage is indicated at 15 in FIG. 3.

The circuit so far described produces a ramp having 256 discrete bit steps so that, so far, no increase in resolution has been obtained. Nevertheless all steps are of precisely equal height so that it is possible to fill in the steps, as indicated much exaggerated in FIG. 5, by use of the digital-to-analogue technique. The line CD indicates the filled in ramp but the portion of this line bridging each step itself consists of a large number of $2^{12}$, i.e. 4096, minute steps.

The filling up voltage is derived from a twelve bit D/A converter 16 having an input connected to an output of the counter $C_3$ and its output connected through a scaling down resistor $R_3$ to a point between the diode $D_1$ and the resistor $R_2$. This adds to the current $$I = \frac{mV\text{ref}}{R_1}$$

flowing through the resistor $R_2$ a current scaled down to 1/256th of I and increasing at each step of the ramp shown in FIG. 5 in $2^{12}$ steps as the count in the counter $C_3$ increases. Each coarse step of the ramp shown in FIG. 5 is thus filled in with 4096 minute steps to produce a total resolution of $2^{20}$. A D/A converter similar in operation to the one described here is the Hewlett Packard Model 5311A Digital-to-Analog Converter.

As an alternative the D/A converter 16 could be replaced by a mark/space generator and associated modulator similar to those utilized for the production of the coarse step ramp.

Other embodiments within the invention will be apparent to those skilled in the art.

What is claimed is:

1. An electronic ramp function generator having a resolution of $2^p = 2^q \times 2^r$ comprising:
    a coarse digital function generator which provides a ramp consisting of $2^q$ equally spaced coarse steps all of equal height, and
    a second and synchronized digital function generator which is connected to fill in each of the steps of the coarse ramp with $2^r$ finer steps,
    said coarse function generator comprising a first counter pulsed by a high frequency oscillator, a second counter pulsed at a variable lower frequency, both counters having $q$ bits, a comparator for comparing the counts in said two counters and arranged to emit a signal upon identity of the counts, a latch which is set each time said comparator provides a signal and reset each time said first counter returns to zero, and a modulator for converting the pulse train of varying mark/space ratio at the output of said latch to a voltage proportional to said mark/space ratio which varies in $2^q$ steps.

2. The ramp function generator of claim 1, said modulator comprising:
    a switching transistor which is connected to the output of the latch and which conducts only when the voltage in the pulse train at said output is high,
    a constant current generator, and
    a resistor and a diode between said constant current generator and said resistor which permits of current flow through the resistor only at times when the transistor is not conducting.

3. The ramp function generator of claim 2, said second function generator comprising:
    a third counter having $r$ bits, pulsed at a frequency greater than said second counter and arranged to pulse said second counter each time it completes a count,
    a digital-to-analogue converter connected to the output of the third counter, and
    a connection through a scaling resistor from the output of the converter to a point between the diode and the resistor.

4. An electronic ramp function generator having a resolution of $2^p = 2^q \times 2^r$ comprising:
    a coarse digital function generator which provides a ramp consisting of $2^q$ equally spaced coarse steps all of equal height, and
    a second and synchronized digital function generator which is connected to fill in each of the steps of the coarse ramp with $2^r$ finer steps,
    said coarse function generator comprising a first counter pulsed at a first frequency, a second counter pulsed at a second variable frequency lower than said first frequency, and means for comparing the sum count in each of said counters, for producing an output signal each time that said sum counts are identical, and for converting said signal to a further output related to the value of the common sum count when said sum counts are identical to produce said ramp of $2^q$ steps.

* * * * *